United States Patent [19]

Lundberg

[11] 4,008,585
[45] Feb. 22, 1977

[54] LOCKING COVER FOR METER CLAMPING RING

[75] Inventor: George A. Lundberg, Pompton Lakes, N.J.

[73] Assignee: E. J. Brooks Company, Newark, N.J.

[22] Filed: Dec. 1, 1975

[21] Appl. No.: 636,356

[52] U.S. Cl. .................................. 70/164; 24/280; 70/232; 292/67; 292/256
[51] Int. Cl.² .................. G01R 11/04; F16L 21/06
[58] Field of Search ...................... 70/232, 164, 32; 292/307 B, 325, 256.67; 24/279, 280

[56] References Cited

UNITED STATES PATENTS

| | | | |
|---|---|---|---|
| 2,003,183 | 5/1935 | Ferguson et al. | 292/307 B |
| 2,033,371 | 3/1936 | Benaggio | 292/307 B |
| 2,345,269 | 3/1944 | Lackey | 24/279 X |
| 3,861,180 | 1/1975 | Heckrotte | 70/164 |
| 3,867,822 | 2/1975 | Morse | 70/232 X |

*Primary Examiner*—J. Franklin Foss
*Attorney, Agent, or Firm*—Robert E. Ross

[57] ABSTRACT

A locking cover for the ends of an electric meter retaining ring comprising a housing for assembly over the ends. The housing has an internal bracket with apertures aligned with a side aperture in the housing and positioned to be aligned with apertures in the outturned ends of the retaining ring to receive a locking member.

The internal bracket retains the housing in position on the meter ring and prevents axial movement of the locking member and is so positioned that the outer end of the locking member when assembled, is spaced at or inside of the outer surface of the housing wall. A collar is assembled into the side aperture and extends outwardly therefrom. The collar is provided with apertures to allow a seal to be assembled across the collar over the end of the locking member disposed therein so that the seal must be broken to remove the locking member, and will provide evidence of attempts to remove the locking cover.

6 Claims, 4 Drawing Figures

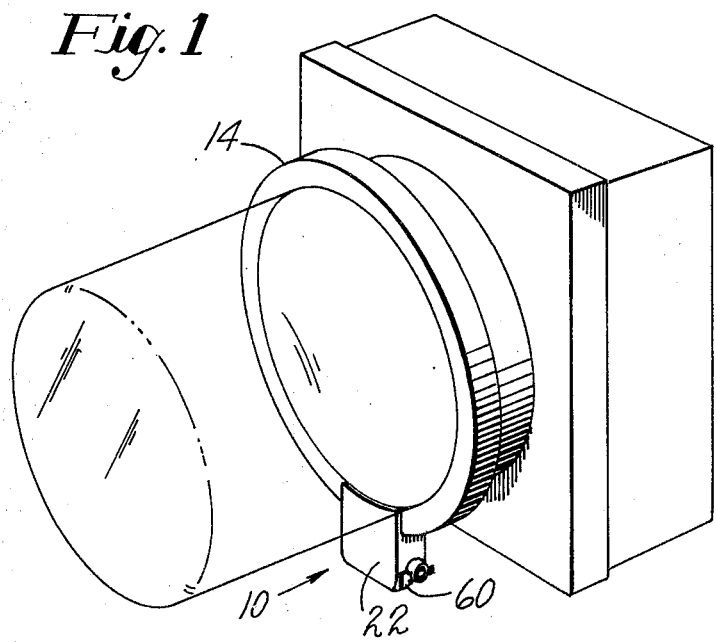
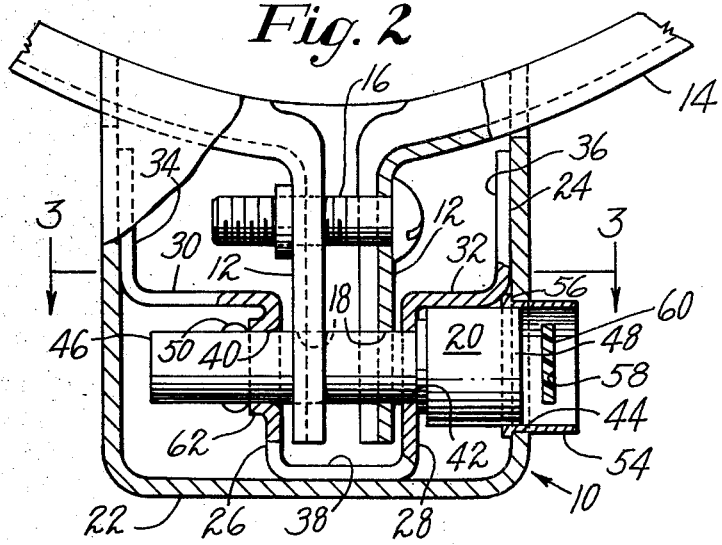
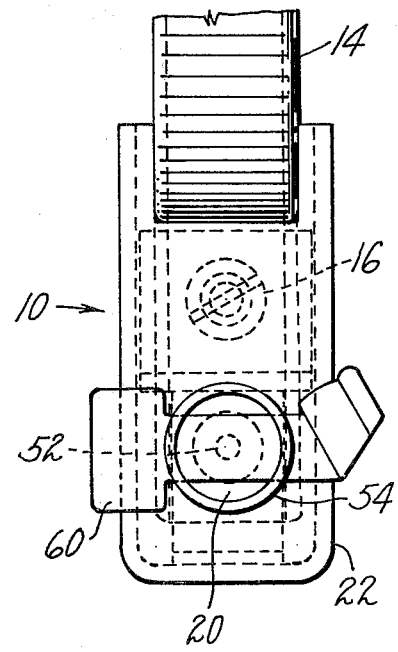
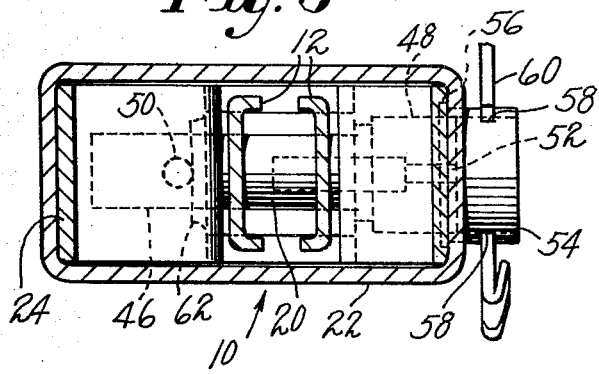

LOCKING COVER FOR METER CLAMPING RING

BACKGROUND OF THE INVENTION

In a commonly used type of electric meter, the meter housing is retained on the base plate by a clamping ring of U-shaped cross section which encloses the adjacent flanges of the base and meter housing. The ends of the clamping ring are turned radially outwardly and threaded means is provided for drawing the ends together to tighten the ring around the meter and base flanges.

Various means have been provided for preventing unauthorized persons from loosening the ring to remove the meter to short across the terminals to bypass the meter.

For example, in U.S. Pat. No. 3,867,822 issued Feb. 25, 1975 to Morse et al, there is illustrated a protective housing for a clamping ring, which has apertures positioned to be aligned with apertures in the ends of the clamping ring to receive a locking cylinder. However, when assembled, the head of the locking member is exposed and can be attacked with various tools, such as vise-grip type pliers to provide sufficient tension thereto to fracture the locking mechanism. Another disadvantage of housings of this type is the fact that being a casting, they are brittle and readily broken, and the internal surfaces that provide a locking seat for the locking balls of the locking member vary sufficiently in dimensions to provide erratic locking action, which is often inadequate.

SUMMARY OF THE INVENTION

In accordance with this invention a protective housing is provided for the ends of the clamping ring of an electric meter or other device. The housing is provided with a U-shaped internal bracket with legs having apertures aligned with a side opening of the housing to receive a locking member so that any axial movement thereof is prevented. The bracket legs are so positioned that the outermost end of the assembled locking member is disposed within the outer face of the housing. A collar extends from the housing around the locking member opening, so that when the locking member is assembled, the head is recessed within the collar. Apertures are provided in the collar walls to receive a seal for extending transversely across the collar in front of the head of the assembled locking member, so that attempts to remove the locking member can be detected.

BRIEF DESCRIPTION OF THE DRAWING

FIG. 1 is perspective view of a meter assembly having a locking device embodying the features of the invention.

FIG. 2 is a plan view, partly in section, of a protective housing assembly mounted onto the clamping ring of an electric meter or the like.

FIG. 3 is a section taken on line 3—3 of FIG. 1.

FIG. 4 is a view of FIG. 2 as seen from the right side.

DESCRIPTION OF THE ILLUSTRATED EMBODIMENT

Referring to the drawing, there is illustrated a protective housing assembly 10 for assembly onto the outwardly turned ends 12 of a clamping ring 14. The ring 14 may be U-shaped in cross-section, for holding together the mating flanges of a meter base and meter housing (not shown) or the like, and the ends 12 are provided with means receiving a clamping screw 16 for tightening the ring, and aligned apertures 18 in the outer portion thereof for receiving a locking member 20 as will appear hereinafter.

The housing assembly 10 comprises a housing portion 22 which is generally rectangular in cross-section and open at one end only. Assembled into the housing is a bracket 24, which has a U-shaped portion forming a pair of legs 26 and 28, outwardly extending brace portions 30 and 32, and attaching portions 34 and 36 which are fastened, such as by spot welding to the inner surface of the housing. The bottom 38 of the U-shaped portion may also be spot welded to the closed end of the housing.

Apertures 40 and 42 are provided in the legs 26 and 28 of the bracket, positioned to be aligned with the openings 18 in the ends of the clamping ring when the housing assembly is mounted onto the ring, and an aperture 44 is provided in the side of the housing in alignment with the apertures 18, 40, and 42 to receive the locking member 20.

The locking member 20 may be, for example, of the type shown in U.S. Pat. No. 3,002,368, which comprises a hollow cylindrical body 46 with an enlarged head 48 at one end and a pair of locking balls 50 projecting from the side of the cylindrical body near the other end. The locking balls are moved into and out of the locking position by means inside the cylinder, and can be released from the locking position by a suitable tool (not shown) inserted into an aperture 52 in the head of the locking member.

The legs 26 and 28 are so positioned in the housing that when the locking member is assembled therein, the head 48 abuts the leg 28 as the locking balls 50 pass through the hole 40, so that when the balls are moved outwardly by the internal mechanism of the locking member, the locking member is securely retained against axial movement in either direction.

The legs 26 and 28 are so positioned in the housing in relation to the wall thereof having the aperture 44 that when the locking member is assembled the outermost end of the head 48 thereof does not protrude beyond the outer surface of the housing, but instead is positioned at or slightly rearwardly of said outer surface, but outwardly of the inner surface, so that the housing wall provides lateral support for the head of the locking member.

In the illustrated embodiment of the invention, a cylindrical collar 54 is assembled into the aperture 44, said collar having an inner end 56 which is flared outwardly against the inner surface of the housing wall, said collar being securely attached, by brazing, welding, or the like, about the periphery to the surrounding housing wall. The collar projects outwardly from the housing a desired distance so that slots 58 can be provided in opposite wall portions thereof to receive a seal 60 as will appear hereinafter.

The housing assembly 10 is readily assembled by placing the housing over the tightened ends of a meter ring so that said ends enter the space between the legs 26 and 28 and the apertures in the legs and the ends of the ring are aligned. The locking member 20 is then inserted through the apertures and the mechanism thereof operated to lock the balls 50 behind the leg 26, so that the housing is retained on the ring ends by the locking device.

A seal 60 may then be assembled through the slots 58, said seal extending across the opening of the collar in front of the locking member so that the seal cannot be removed without destroying the seal. The seal 60 illustrated is of the type shown in U.S. Pat. No. 2,926,944 issued Mar. 1, 1960 to S. M. Moberg; however, any other suitable type of seal may be used, such as the padlock type of seal shown in U.S. Pat. No. 3,375,033.

In the illustrated embodiment of the invention the housing shell 22 is formed of drawn metal case-hardened after forming. An attempt to drill into the housing to gain access to the locking balls to remove the locking member requires special tools and is difficult and time consuming.

Access to the locking balls by a tool inserted between the forward end of the housing and the ring is prevented by the brace portion 30 of the bracket, as shown in FIG. 2.

Attempts to remove the collar 54 will usually result in the collar being bent across the opening to further inhibit removal of the locking device. If the collar, also case-hardened, is removed with a metal saw the end of the locking member is still not exposed and cannot be grasped by any tool to apply tension thereto. It is supported against angular sideways blows by the surrounding edge of the housing.

If a hole is successfully drilled through the housing opposite the other end of the locking member, blows against the end of the locking member are resisted by the bracket leg 26, which is welded or otherwise fastened to the housing at each end.

The aperture 40 in the leg 26 is surrounded by a flared portion 62, which may be accurately sized to provide a rigid abutment for the locking balls to bear against to prevent axial movement of the locking member in the direction of removal.

Since certain changes apparent to one skilled in the art may be made in the illustrated embodiment of the device without departing from the scope of the invention, it is intended that all matter contained herein be interpreted in an illustrative and not in a limiting sense.

I claim:

1. A locking assembly particularly adapted for use with an electric meter clamping ring of the type having outwardly turned adjacent ends fastened together, and aligned apertures for receiving a locking member of the type having an enlarged head at one end and expansible locking projections at the other end, said assembly comprising a cup-shaped housing open at one end only to receive and enclose the outwardly turned ends, one side of said housing wall having an aperture positioned to be aligned with the apertures in the clamping ring ends when assembled thereon to receive the locking member, a pair of locking member engaging legs disposed in the housing, said legs being secured to the housing and having apertures aligned with the aperture in said one side of the housing to receive the locking member and being positioned in the housing in such spaced relation to each other and to said side of the housing that the enlarged head of an assembled locking member bears against the leg nearest said side of the housing, the locking mechanism of the locking device extends through the aperture in the other leg and locks on the remote side thereof to prevent axial movement of said locking member and retain it so positioned that the outer surface of the enlarged head is disposed at or inside of the outer surface of the housing wall.

2. A locking assembly as set out in claim 1 in which a collar is provided surrounding said opening in said one side of the housing wall to surround the head end of an assembled locking device, said collar projecting from the outer surface of said wall and having opposing apertures therein to receive a seal transversely across the collar outside of the end of the assembled locking device.

3. A locking assembly as set forth in claim 1 in which said locking member engaging legs are provided by a U-shaped member, the bottom of the U being secured to the bottom wall of the housing opposite the open end, the upper ends of the legs being secured to the housing sides by brace members having a width as great as that of the housing thereby blocking access to the assembled locking member from the open end of the housing.

4. A locking assembly comprising a clamping ring having outwardly turned adjacent ends removably fastened together, and aligned apertures in said ends, a housing disposed over said ends, said housing having an aperture in one side wall and internal brackets disposed on opposite sides of said ends of the clamping ring, said brackets being rigidly positioned in said housing and having apertures aligned with the apertures in said ends, a locking member assembled through the bracket apertures, the clamping ring apertures, and the aperture in the side wall of the housing, said locking member and said brackets having cooperating means preventing axial movement of the assembled locking member, a collar disposed about the aperture in the side wall and projecting from the outer surface of the wall, the outer surface of the locking member being recessed behind the outer end of the collar, said collar having apertures in opposing wall portions, and a seal extending through the apertures over the outer face of the locking member.

5. A locking assembly particularly adapted for use with a closure fastener of the type having projecting collateral ends with aligned apertures for receiving a locking member of the type having an enlarged head at one end and expansible locking projections at the other end, said assembly comprising a cup-shaped housing open at one end only to receive and enclose the collateral ends, one side of said housing wall having an aperture positioned to be aligned with the apertures in the clamping ring ends when assembled thereon to receive the locking member, a pair of locking member engaging legs disposed in the housing, said legs being secured to the housing and having apertures aligned with the aperture in said one side of the housing to receive the locking member and being positioned in the housing in such spaced relation to each other and to said side of the housing that the enlarged head of an assembled locking member bears against the leg nearest said side of the housing, the locking mechanism of the locking device extends through the aperture in the other leg and locks on the remote side thereof to prevent axial movement of said locking member.

6. A locking assembly as set out in claim 5 in which the locking member engaging legs are provided by a U-shaped member, the bottom of the U being secured to the bottom wall of the housing opposite the open end, the upper ends of the legs extending to the housing sides by brace members having a width as great as that of the housing, thereby blocking access to the assembled locking member from the open end of the housing.

* * * * *